(12) United States Patent
Kwak

(10) Patent No.: US 7,080,332 B2
(45) Date of Patent: Jul. 18, 2006

(54) SPICE SIMULATION SYSTEM FOR DIODE AND METHOD OF SIMULATION USING THE SAME

(75) Inventor: Sang Hun Kwak, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/024,630

(22) Filed: Dec. 30, 2004

(65) Prior Publication Data

US 2006/0031793 A1 Feb. 9, 2006

(30) Foreign Application Priority Data

Aug. 4, 2004 (KR) .................... 10-2004-0061413

(51) Int. Cl.
*G06F 17/50* (2006.01)

(52) U.S. Cl. .............................. 716/4; 716/5

(58) Field of Classification Search ............... 716/3–5, 716/18; 703/13–14
See application file for complete search history.

(56) References Cited

U.S. PATENT DOCUMENTS 6,161,212 A * 12/2000 Seely ..................... 716/4

* cited by examiner

*Primary Examiner*—Paul Dinh
(74) *Attorney, Agent, or Firm*—Oblon, Spivak, McClelland, Maier & Neustadt, P.C.

(57) ABSTRACT

A system and method for simulating a diode device measures electrical characteristics of a plurality of diodes; normalizes the measured electrical characteristics of the diode; extracts a plurality of device parameters of each of the diodes from the normalized characteristics; converts the device parameters of each of the diodes to values per unit area; obtains a linear equation from the converted device parameters; and predicts electrical characteristics of certain diode area from the linear equation and the device parameters. The linear equation is obtained by a least square method of the regression analysis to extract the device parameters of each of the diodes which are converted to value per unit area. The device parameters are obtained by a simultaneous equation which is derived from both a diode having larger area component and a diode having greater length component.

9 Claims, 8 Drawing Sheets

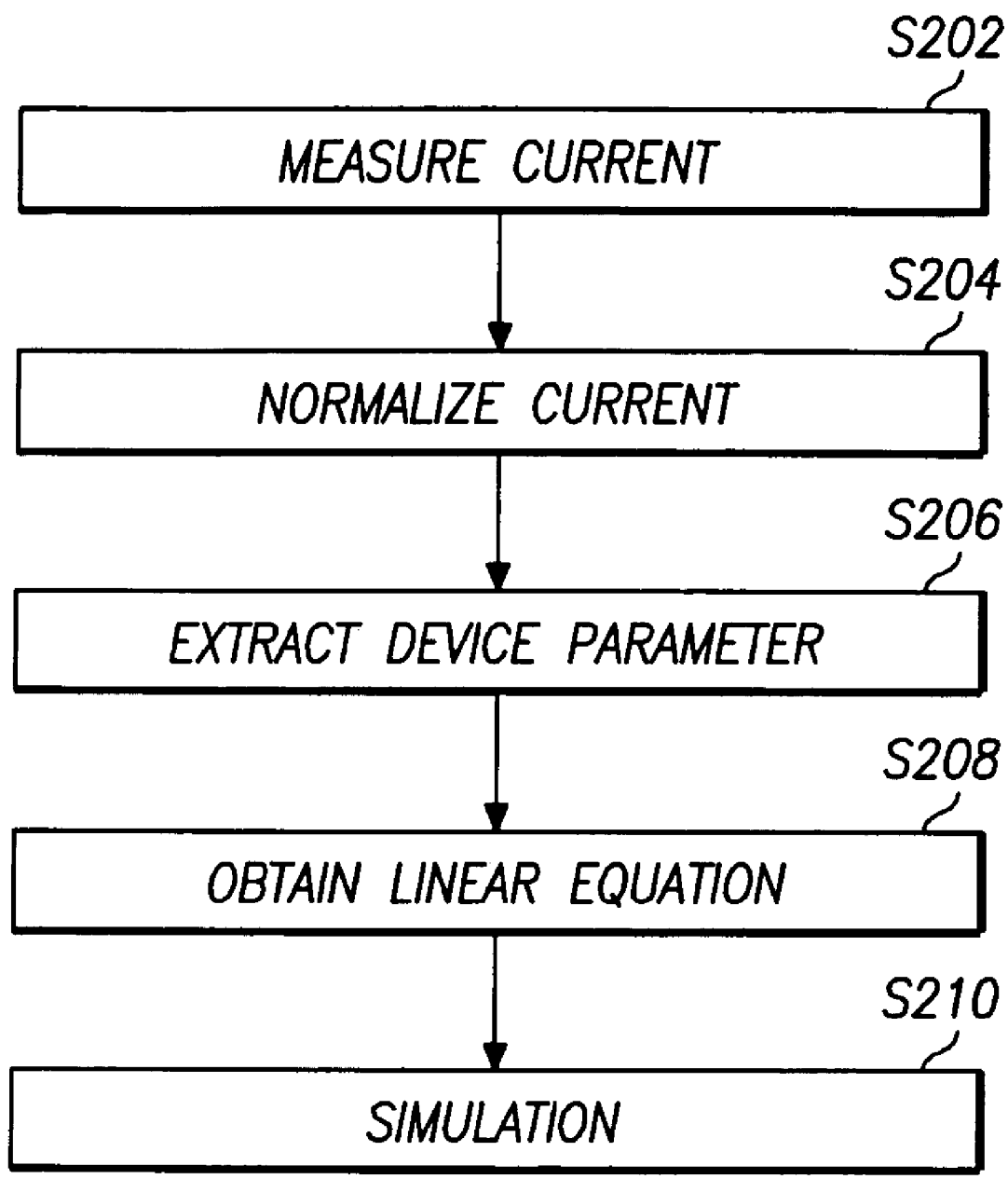

SPICE SIMULATION SYSTEM FOR DIODE AND METHOD OF SIMULATION USING THE SAME

BACKGROUND OF THE INVENTION

1. Field of the Invention

The present invention relates to a method for simulating a diode, and more specifically, to a method for simulating the diode by using SPICE (Simulation Program with Integrated Circuit Emphasis).

2. Description of the Related Art

Circuit simulation is performed in the design and manufacture of electronic circuits to determine if the electronic circuits would operate in the intended manner and to predict the circuits' performance. Among the simulation programs, SPICE is the most widely used general-purpose circuit simulation program. SPICE simulates, with input information of model data, device parameter data and design data, a circuit model by employing equations which attempt to define mathematically the operation of the various circuit components in the circuit design, and provides output signal information as a result of the simulation.

For simulating a diode with SPICE, electrical characteristics are measured from two diode structures having different areas and lengths and then device parameters of the diodes are extracted from the measured results. These values are normalized to obtain a SPICE model of the diode. By applying area and length variables of a diode to be simulated by the SPICE model, electrical characteristics of the diode can be predicted.

However, when the SPICE model is applied to any values of area and length variables, the predicted result may not be exact, because the diodes used in extracting the device parameters are structurally different from the simulated diodes in terms of the number of contacts to the diode, distance from the end of the contact, current flow, crowding effect and so on. Therefore the conventional SPICE model may fail to exactly reflect varying electrical characteristics of the structurally different diode.

FIGS. 5a–5d show voltage-current characteristic curves for illustrating the problem of the conventional simulation method. In FIGS. 5a–5d, the solid line represents simulated current curve while the dotted line depicts actually measured current curve. The I–V characteristic curve of FIG. 5a shows that the simulated curve approximately identical to the measured curve when diode structure having area of 18,750 $\mu m^2$ and peripheral length of 550 $\mu m$ is employed. However, the I–V characteristic curves of FIGS. 5b to 5d reveal that the simulated curves are deviated from the actually measured I–V characteristics when the SPICE model obtained from the conventional method is applied to the differently structured diodes having area of 7,875 $\mu m^2$ and peripheral length of 43,876 $\mu m$, area of 8,500 $\mu m^2$ and peripheral length of 34,000 $\mu m$, and area of 2,627.64 $\mu m^2$ and peripheral length of 33,408 $\mu m$, respectively.

SUMMARY OF THE INVENTION

The purpose of the present invention is to provide a scalable model that can be applied to any area and length of a diode structure.

Another purpose of the present invention is to improve the prediction of electrical characteristics of the diode device and efficiency of the circuit design.

The method for simulating diode devices according to the present invention includes the steps of: measuring electrical characteristics of a plurality of diodes; normalizing the measured electrical characteristics of the diode; extracting a plurality of device parameters of each of the diodes from the normalized characteristics; converting the device parameters of each of the diodes to values per unit area; obtaining a linear equation from the converted device parameters; and predicting electrical characteristics of certain diode area from the linear equation and the device parameters.

It is preferable that the step of obtaining the linear equation employs a least square method of the regression analysis to extract the device parameters of each of the diodes which are converted to value per unit area.

In the step of extracting the device parameter, it is preferable that the device parameters include a reverse saturation current ($I_S$), Knee current ($I_K$), emission coefficient (N), and sheet resistance ($R_S$). Further, the measurement of the electrical characteristics of the diode device is measuring current value according to the variation of voltage.

According to one embodiment of the present invention, the linear equation is:

$$R_S(10^{RS1} * AREA^{RS2}) * AREA$$

$$I_K = (10^{IK1} * AREA^{IK2}) / AREA$$

$$N = N_1 - [N_2 * \log 10(AREA)].$$

According to another aspect of the present invention, a system for SPICE simulating a diode device includes: a measuring module for measuring current varying as the variation of voltage from a plurality of diodes; a current calculating module for calculating normalized current value from the measured current; a device parameter extracting module for extracting device parameters of each of the diodes by using the calculated current value; a linear equation module for obtaining a linear equation to the device parameters; and a prediction module for predicting the electrical characteristics of each of the diodes from the obtained linear equation and the device parameters.

It is preferable that the linear equation modules employs a least square method of regression analysis after converting the device parameters to values per unit area, and the linear equation is:

$$R_s = (10^{RS1} * AREA^{RS2}) * AREA$$

$$I_k = (10^{IK1} * AREA^{IK2}) / AREA$$

$$N = N_1 - [N_2 * \log 10(AREA)].$$

The device parameters include a reverse saturation current ($I_s$), Knee current ($I_k$), emission coefficient (N), and sheet resistance ($R_s$).

These and other aspects will become evident by reference to the description of the invention.

BRIEF DESCRIPTION OF DRAWINGS

FIG. 2 is a flow chart for illustrating a method for SPICE simulation of a diode device according to the present invention.

DETAILED DESCRIPTION OF THE INVENTION

Figure 1:
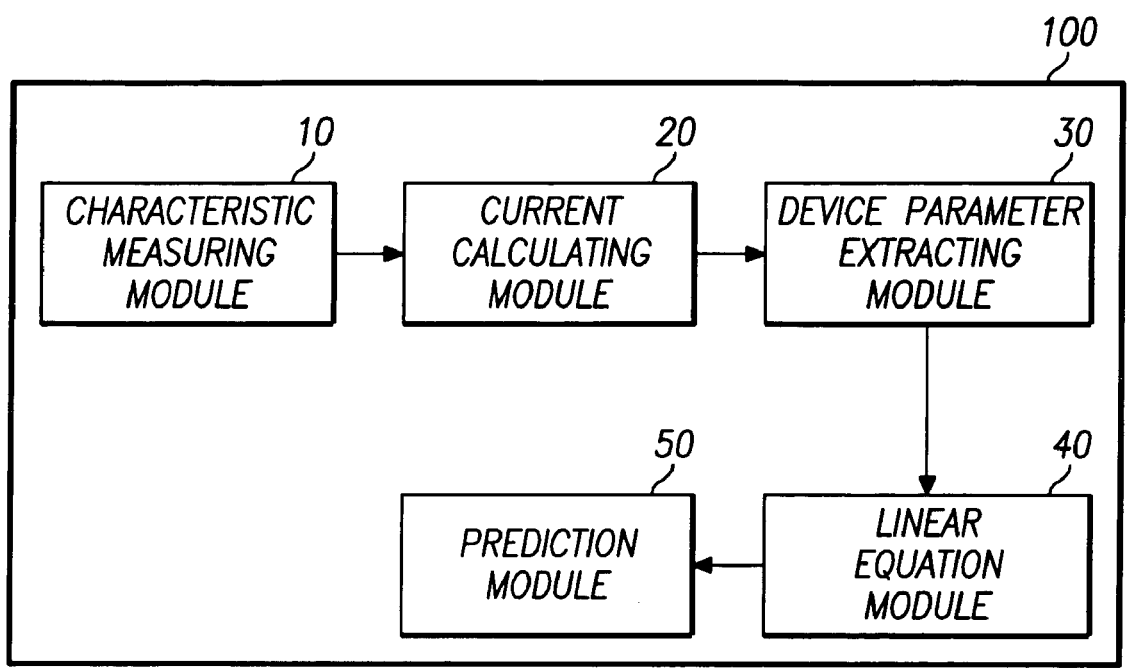
FIG. 1 is a block diagram of a system for SPICE simulation of a diode device according to the present invention.
Figure 3A:
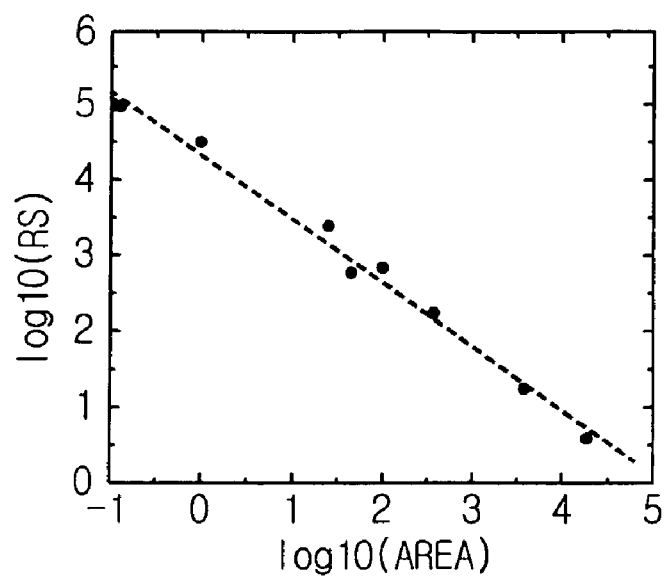
FIGS. 3a–3c are graphs for obtaining a linear equation according to the present invention.
Figure 3B:
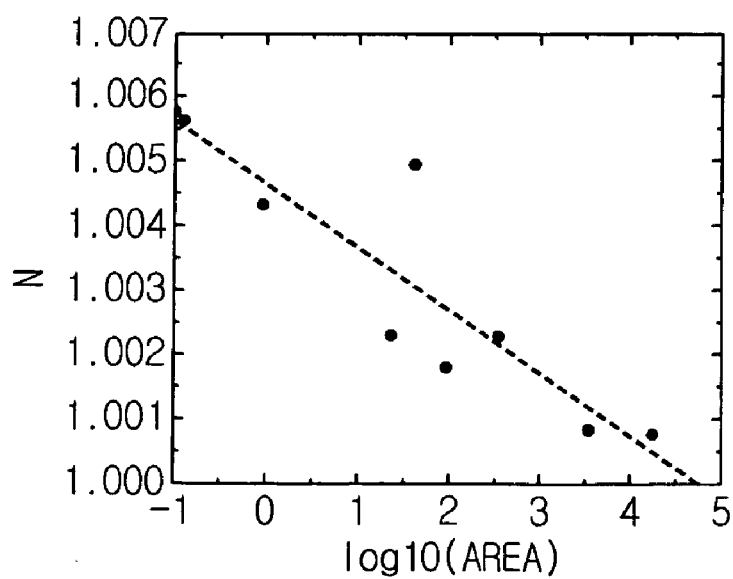
Figure 3C:
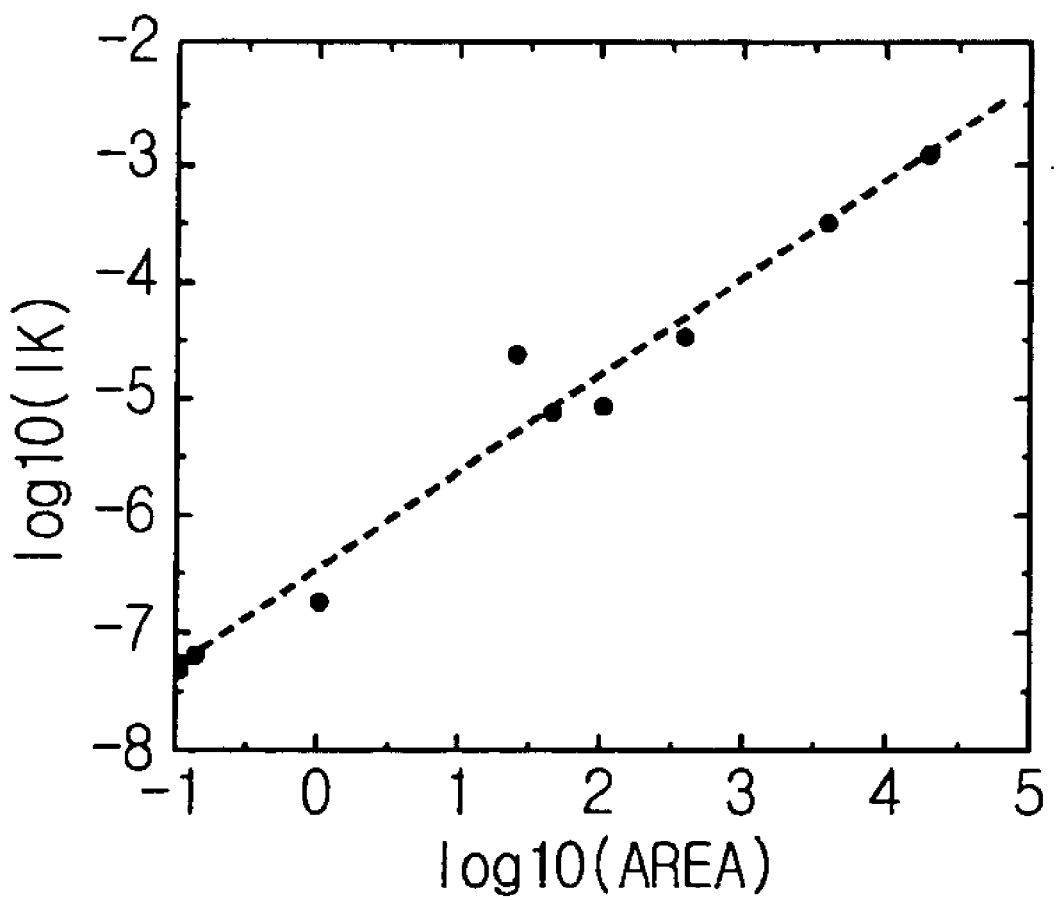
Figure 4A:
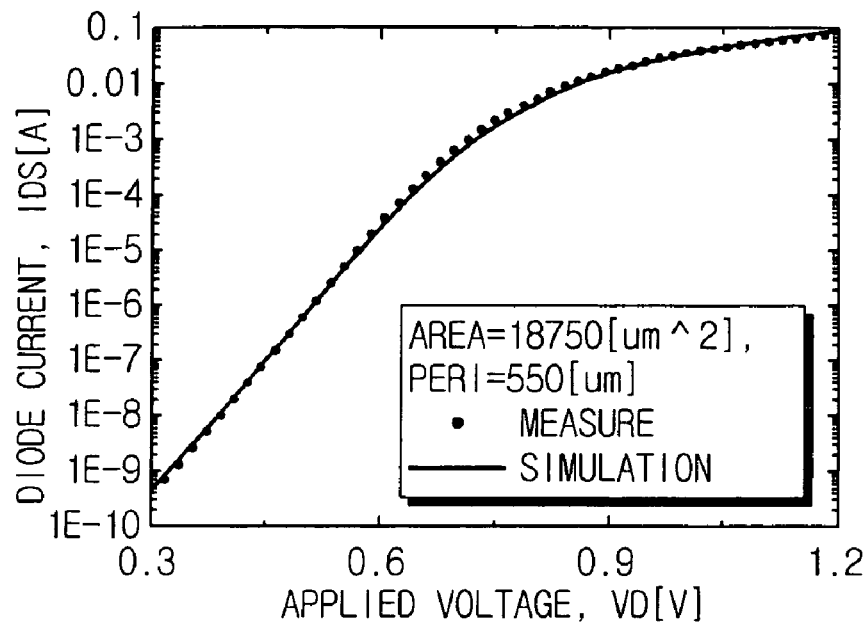
FIGS. 4a–4d are voltage-current characteristic curves for comparing the measured curve to the simulated curve according to the present invention.
Figure 4B:
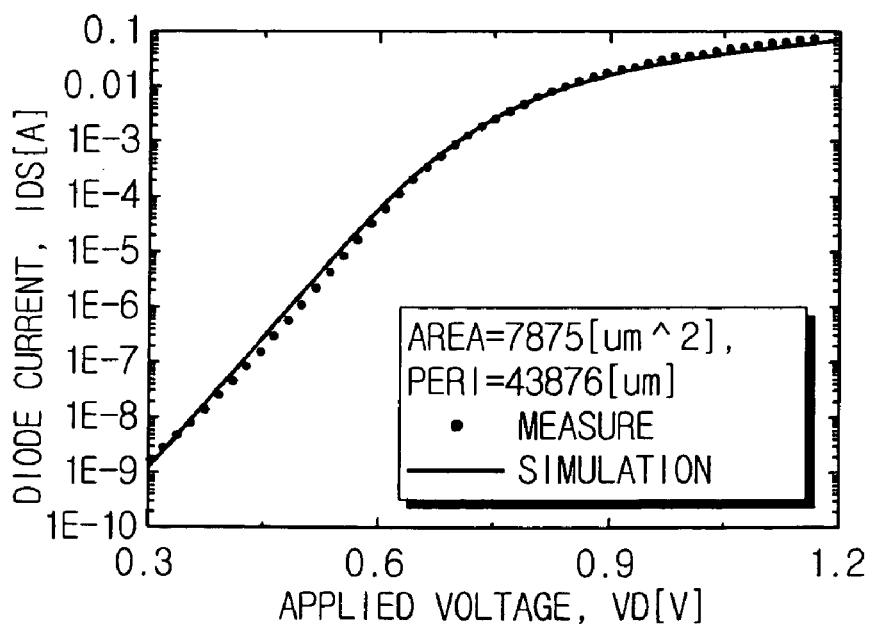
Figure 4C:
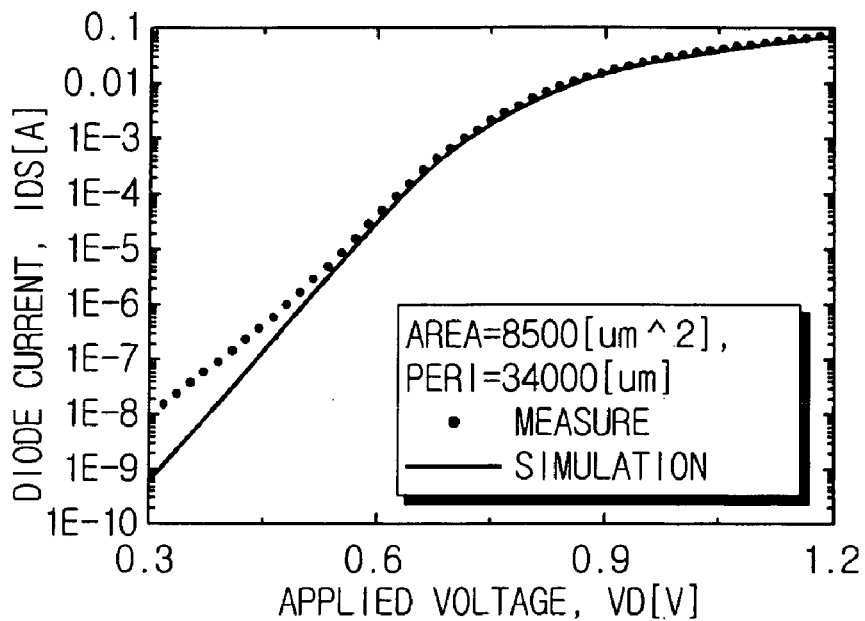
Figure 4D:
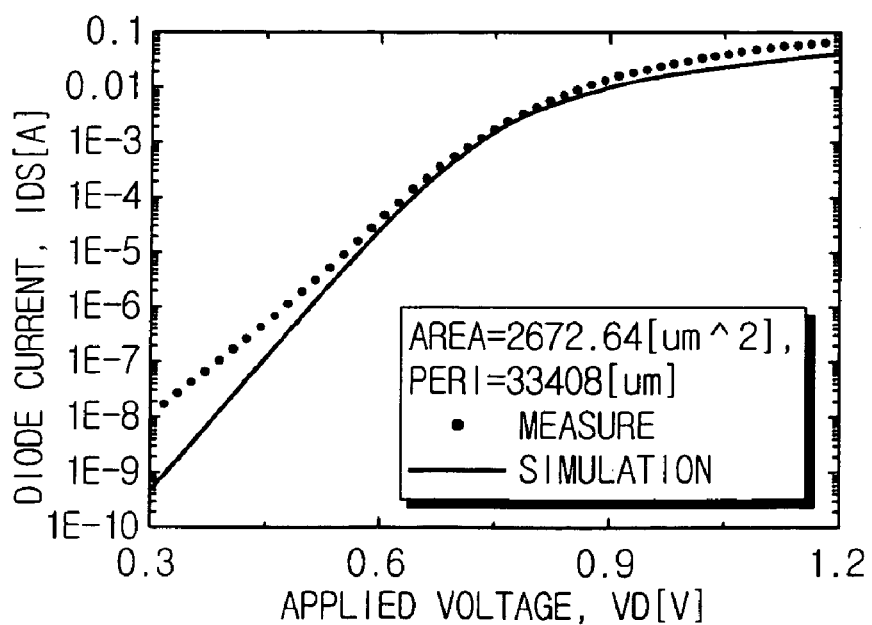
Figure 5A:
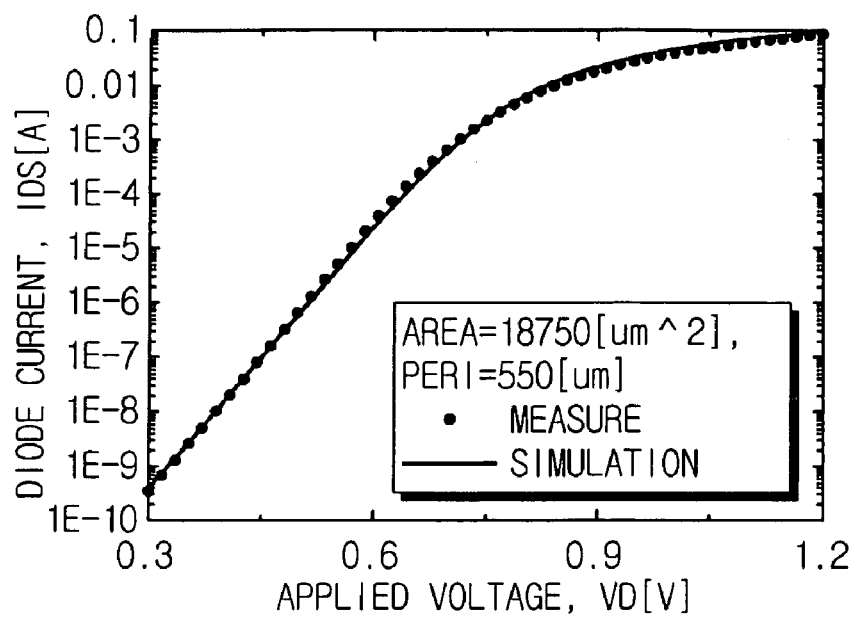
FIGS. 5a–5d are voltage-current characteristic curves for comparing the measured curve to the simulated curve according to the conventional method.
Figure 5B:
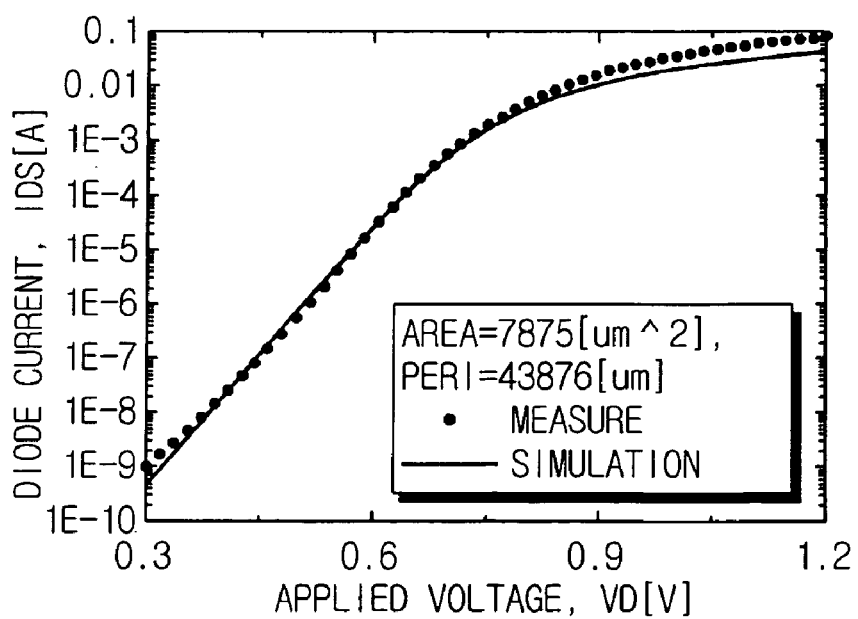
Figure 5C:
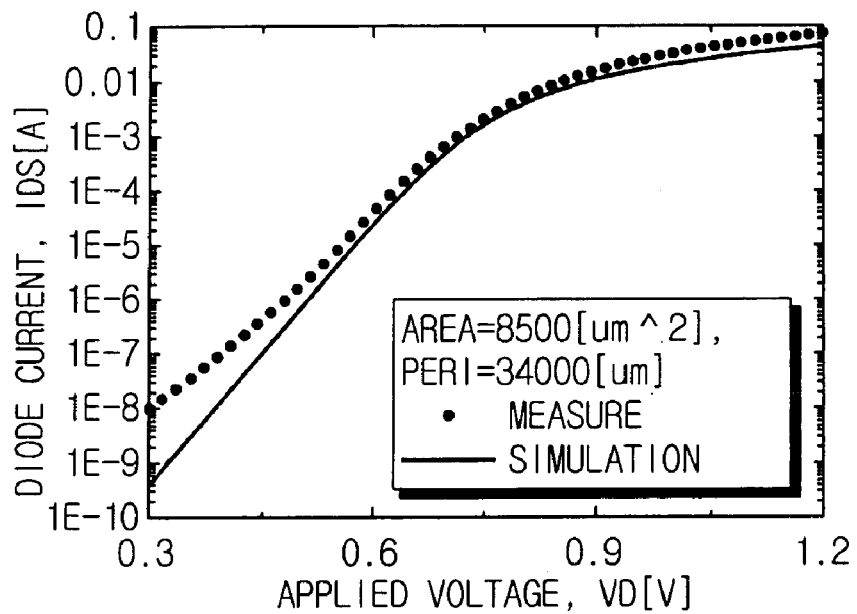
Figure 5D:
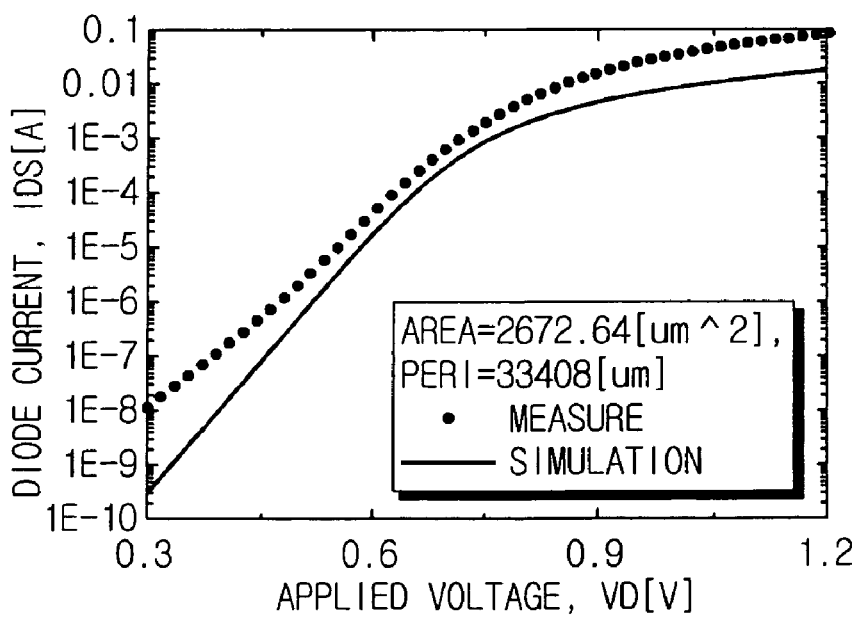

FIG. 1 is schematic diagram of a system for SPICE simulating a diode device according to the present invention.

As shown in FIG. 1, a diode SPICE simulating system 100 includes: a measuring module 10 for measuring electrical characteristics of a plurality of diodes; a current calculating module 20 for calculating normalized current value from the measured current; a device parameter extracting module 30 for extracting device parameters of each of the diodes by using the calculated current value; a linear equation module 40 for obtaining a linear equation to the device parameters; and a prediction module 50 for predicting the electrical characteristics of each of the diodes from the obtained linear equation and the device parameters. Modules 10, 20, 30, 40 and 50 may be implemented on a computer, such as a personal computer that has SPICE loaded thereon. The characteristic measuring module 10 may also include a peripheral device that performs the device measurement (such as a current and/or voltage meter) and provides the measurement results to the characteristic measuring module 10.

The measuring module 10 measures current value, which vary because of voltage variations of the plurality of diodes having various size and structures, such as planar diodes and finger diodes. Among several geographical factors of a diode, the area factor is used to determine the number of equivalent parallel devices of a specific model. The current calculating module 20 normalizes the measured current value by dividing the measured current value by the number of diodes with regard to each particular diode structure.

The device parameter extracting module 30 draws out device parameters to each of the diodes by applying the normalized current values to a predetermined equation. The linear equation module 40 derives a linear equation from the extracted device parameters to each of the diode devices by using a least square method of regression analysis. The prediction module 50 then predicts the electrical characteristics of each of the diodes from the obtained linear equation and device parameters.

With reference to FIG. 2, a method is explained for simulating a diode device by using the diode SPICE simulating system according to the present invention.

Referring to FIG. 2, the current value according to the voltage variation is measured by the measuring module 10 from a plurality of diode of various structures such as planar diodes and finger diodes at step S202. Next, the current calculating module 20 obtains a normalized current value ($i_d$) by dividing the measured current value with the number of diodes for each structure at step S204.

Then, device parameters that are affected by area are extracted from the normalized current value ($i_d$) at step S206. The device parameters that are affected by area include reverse saturation current ($I_s$), Knee current ($I_k$), emission coefficient (N), and sheet resistance ($R_s$).

Among the device parameters, the reverse saturation current ($I_s$) can be represented by a function of area i.e., $I_{Seff}=AREA_{eff}*I_S$, and the knee current ($I_k$), which is one of parameters determining the diode current can be represented by a function of area i.e., $I_{keff}=I_K*AREA_{eff}$.

The emission coefficient (N) varies depending on the diode size and therefore is empirically determined.

The device parameters of IK, IS and N can be obtained by the following Equation 1:

$$id1 = ISeff \cdot \left(\exp\left(\frac{vd}{N \cdot vt}\right) - 1\right) \quad \text{[Equation 1]}$$

$$id = \frac{id1}{1 + \left(\frac{id1}{IKeff}\right)^{1/2}}$$

The device parameter $R_s$ represents an electrical resistance of a diode per unit area.

In an embodiment of the present invention, the device parameters extracted in step S206 may be exemplified by the following Table.

TABLE

```
.SUBCKT pdd_cir da dc parea=10 pperi=10
DAC da dc AA_DIODE area=parea pj=pperi
******************************************
.param pa_js    = 2.858E-19
.param pa_jsw   = 1.550E-19
.param pa_rs1   = 2.558
.param pa_rs2   = -5.000E-1
.param pa_ik1   = -3.000
.param pa_ik2   = 1.827E-2
.param pa_n1    = 1.043
.param pa_n2    = 4.486E-4
******************************************
.MODEL AA_DIODE d
+ LEVEL   = 3
+ JS      = pa_js
+ JSW     = pa_jsw
+ RS      = '( pwr( 10, pa_rs1) * pwr ( parea, pa_rs2)) * parea'
+ IK      = '( pwr( 10, pa_ik1) * pwr ( parea, pa_ik2)) / parea'
+ N       = 'pa_n1 - ( pa_n2 * log10(parea))'
+ BV      = 10.5484
+ IBV     = 1E-5
+ IKR     = 0.1
+ CJO     = 9.753359E-16
+ VJ      = 0.7342373
+ MJ      = 0.3481683
+ CJSW    = 6.754785E-17
+ MJSW    = 0.1317749
+ PHP     = 0.4833717
+ EG      = 1.1506674
+ XTI     = 3
+ TLEV    = 0
+ TRS     = 1.953512E-3
******************************************
.ENDS
```

The extracted device parameters $I_K$, N, $R_S$ are applied to the linear equation module 40. Each of the applied device parameters is converted to a normalized area value (a value corresponding to area per single diode) and a linear equation of Equation 2 is obtained with respect to each of the device parameters at step S208.

$$R_s=(10^{RS1}*AREA^{RS2})*AREA$$

$$I_k=(10^{IK1}*AREA^{IK2})/AREA$$

$$N=N_1-[N_2*\log10(AREA)]. \quad \text{[Equation 2]}$$

Equation 2 can be obtained by the least square method of regression analysis. The principle of the least square method is that variation on a dependent variable can be partitioned, or divided into parts, according to the source of variation. The regression analysis is to fit a line through the points. Specifically, a program computes a line so that the squared deviations of the observed points from that line are minimized. This procedure is called least square. When obtaining the linear equation by using the least square method, values on X-axis (area) and Y-axis (extracted value) of the device parameters $I_K$ and $R_S$ are expressed in logarithmic values. The X-axis value (area) of the device parameter N is represented in logarithms, while the Y-axis value (extracted value) is not.

The device parameter $I_S$ can be divided into $J_S$ and $J_{SW}$ according to the diode structure. The $J_S$ and $J_{SW}$ are used as SPICE model parameters. $I_s$ (reverse saturation current) is a function of the area represented by $I_{Seff}=I_S*AREA_{eff}$, and can be used identically to JS. Further, $J_{SW}$ is a function of the length represented by $J_{SWeff}=J_{SW}*P_{jeff}$ (where, $P_{jeff}$ means effective perimeter). Thus, the parameter $J_S$ is affected by the amount of current of a diode having larger area, while the parameter $J_{SW}$ has more dependency on the amount of current of a diode having longer length. When the longer diode is concerned, the effect of current from the area component exists but the influence of the length is stronger. Diode current is determined by two components: area component and perimeter component. In the present invention, model parameters are obtained by simultaneous equation which is derived from both a diode having larger area component and a diode having greater length component.

The parameters $J_S$ and $J_{SW}$ can be obtained by the following Equation 3.

$$I_{S1}=J_S*AREA_1+J_{SW}*PERI_2$$

$$I_{S2}=J_S*AREA_2+J_{SW}*PERI_2 \quad \text{[Equation 3]}$$

Where, $I_{S1}$ is the reverse saturation current ($I_S$) of a diode having relatively larger area and $I_{S2}$ is the reverse saturation current ($I_S$) of a diode having relatively longer length.

The obtained parameters $J_S$ and $J_{SW}$ are determined with values that have the smallest range of deviations among the measured values. That is, at first the area and length are calculated from the $J_S$ and $J_{SW}$. Then the ratio of the calculated value and original $I_S$ values is obtained and summed. The range of the deviation can be clearly defined by making smaller the value that becomes smaller than '1' when it is squared and making greater the value that becomes greater than '1' when it is squared. The reference '1' is employed in an ideal case.

In this manner, a mean value of the summed ratio to every diode structure is obtained and a mean value that is closest to '1' is looked up to extract parameters $J_S$ and $J_{SW}$.

The $J_S$ and $J_{SW}$ parameters obtained in this way and Equation 2 are represented in the form of a SPICE library and employed in the circuit simulation. That is, by using SPICE program, electrical characteristics of a diode are simulated as shown in FIG. 4 at step S210. Here, the SPICE inputs N, RS and IK for the prediction of the electrical characteristics with regard to any parameter values (area and length of a diode) are substituted by Equation 1, and $J_S$ and $J_{SW}$ are input by the extracted values explained above.

FIGS. 4a–4d are graphs for the comparison of the I–V characteristic curves obtained by the simulation carried out according to the present invention and the I–V characteristic curves obtained by actual measurement.

As shown in FIGS. 4a–4d, the measured curves (dotted line) and simulated curves (solid line) show approximately the same trajectories for four diode devices having areas of 18,750 μm² and peripheral length of 550 μm (FIG. 4a), area of 7,875 μm² and peripheral length of 43,876 μm (FIG. 4b), area of 8,500 μm² and peripheral length of 34,000 μm (FIG. 4c), and area of 2,627.64 μm² and peripheral length of 33,408 μm (FIG. 4d), respectively. When compared with the conventional results shown in FIGS. 5a–5d, the result of the present invention shown in FIGS. 4a–4d reveal the significant improvement of accuracy and scalability of the SPICE model according to the present invention.

The present application contains subject matter related to that disclosed in Korean priority patent application No. 2004-61413, filed on Aug. 4, 2004, the entire contents of which is hereby incorporated by reference in its entirety.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A computer implemented method for simulating a diode device comprising the steps of:
   measuring electrical characteristics of a plurality of diode devices;
   normalizing the electrical characteristics measured in said measuring step; extracting a plurality of device parameters for each of the plurality of diode devices from the normalized electrical characteristics;
   converting the plurality of device parameters for each of the diode devices to values per unit area (AREA);
   obtaining a linear equation from the converted device parameters; and
   predicting electrical characteristics for a diode area from the linear equation and the device parameters.

2. The method of claim 1, wherein the step of obtaining the linear equation includes performing a least square method of regression analysis.

3. The method of claim 1, wherein the step of extracting the device parameters includes extracting reverse saturation current ($I_S$), Knee current ($I_K$), emission coefficient (N), and sheet resistance ($R_S$).

4. The method of claim 1, wherein the electrical characteristics include current value according to voltage variation.

5. The method of claim 1, wherein the obtaining step includes obtaining a linear equation of Sheet Resistance: $(R_S)=(10^{RS1}*AREA^{RS2})*AREA$ Knee Current: $(I_K)=(10^{IK1}*AREA^{IK2})/AREA$ Emission Coefficient: $(N)=N_1-[N_2*\log 10(AREA)]$.

6. A computer implemented simulating system for a diode device including:
   a measuring module configured to measure an electrical current according to voltage variation;
   a current calculating module configured to calculate a normalized current value from the measured current;
   a device parameter extracting module configured to extract device parameters of each of the diodes by using the calculated current value;
   a linear equation module configured to obtain a linear equation of the device parameters; and
   a prediction module configured to obtain the electrical characteristics of each of the diodes from the linear equation obtained in the linear equation module and the device parameters.

7. The system of claim 6, wherein the linear equation module is configured to extract the device parameters for each diode convert to values per unit area by using a least square method of regression analysis.

8. The system of claim 6, wherein the linear equation is

Sheet Resistance: $(R_S)=(10^{RS1}*AREA^{RS2})*AREA$

Knee Current: $(I_K)=(10^{IK1}*AREA^{IK2})/AREA$

Emission Coefficient: $(N)=N_1-[N_2*\log 10(AREA)]$.

9. The system of claim 6, wherein the device parameters include reverse saturation current ($I_S$), Knee current ($I_K$), emission coefficient (N), and sheet resistance ($R_S$).

* * * * *